US009553456B2

(12) United States Patent
Choi et al.

(10) Patent No.: US 9,553,456 B2
(45) Date of Patent: Jan. 24, 2017

(54) POWER CONVERTER IN RESONANCE POWER TRANSMISSION SYSTEM, AND RESONANCE POWER TRANSMISSION APPARATUS

(75) Inventors: Jin Sung Choi, Gimpo-si (KR); Sang Wook Kwon, Seongnam-si (KR); Yun Kwon Park, Dongducheon-si (KR); Eun Seok Park, Suwon-si (KR); Young Tack Hong, Seongnam-si (KR); Young Ho Ryu, Yongin-si (KR); Nam Yun Kim, Seoul (KR); Dong Zo Kim, Yongin-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 775 days.

(21) Appl. No.: 13/223,640

(22) Filed: Sep. 1, 2011

(65) Prior Publication Data

US 2012/0056487 A1 Mar. 8, 2012

(30) Foreign Application Priority Data

Sep. 2, 2010 (KR) ........................ 10-2010-0085873

(51) Int. Cl.
*H01F 37/00* (2006.01)
*H01F 38/14* (2006.01)
(Continued)

(52) U.S. Cl.
CPC ................ *H02J 5/005* (2013.01); *H02J 17/00* (2013.01); *H02M 7/48* (2013.01); *H03H 7/00* (2013.01);
(Continued)

(58) Field of Classification Search
CPC ........... H04B 5/0037; H02J 7/25; H02J 5/005; H02J 17/00; H01F 38/14; H02M 2007/4822; H02M 7/48; H02M 2007/4815
(Continued)

(56) References Cited

U.S. PATENT DOCUMENTS 5,095,285 A 3/1992 Khatibzadeh
6,359,513 B1 * 3/2002 Kuo ...................... H03F 1/0288
330/264
(Continued)

FOREIGN PATENT DOCUMENTS

JP 04236169 A * 8/1992
JP 09046148 A * 2/1997
(Continued)

OTHER PUBLICATIONS

Paul Horowitz and Winfield Hill, The Art of Electronics, 1989, Cambridge University Press, Second Edition, pp. 41-42.*
(Continued)

*Primary Examiner* — Hal Kaplan
(74) *Attorney, Agent, or Firm* — NSIP Law

(57) ABSTRACT

A power converter for transmitting a resonance power is provided that includes: an input end that receives a direct current (DC) voltage of a predetermined level; a first power converter that converts the DC voltage of a predetermined level to an alternating current (AC) signal using a first switching pulse signal having substantially the same frequency as a resonant frequency; a second power converter that converts the DC voltage of a predetermined level to an AC signal using a second switching pulse signal having an opposite phase to the first switching pulse signal; a first short circuit that reduces or eliminates an odd harmonic of the AC signal outputted from the first power converter, and provides
(Continued)

the AC signal; and a second short circuit that reduces or eliminates an odd harmonic of the AC signal outputted from the second power converter, and provides the AC signal.

18 Claims, 13 Drawing Sheets

(51) Int. Cl.
*H02M 7/48* (2007.01)
*H02J 5/00* (2016.01)
*H02J 17/00* (2006.01)
*H03H 7/00* (2006.01)
*H02M 7/00* (2006.01)

(52) U.S. Cl.
CPC ..... *H02M 7/003* (2013.01); *H02M 2007/4815* (2013.01); *Y02B 70/1441* (2013.01)

(58) Field of Classification Search
USPC .......................................... 307/104; 320/108
See application file for complete search history.

(56) References Cited

U.S. PATENT DOCUMENTS

| | | | | |
|---|---|---|---|---|
| 6,980,057 | B2 * | 12/2005 | Morimoto | H03F 3/265 330/124 R |
| 7,567,128 | B2 * | 7/2009 | Oka et al. | 330/302 |
| 8,674,551 | B2 * | 3/2014 | Low et al. | 307/104 |
| 2007/0024377 | A1 * | 2/2007 | Wang et al. | 330/305 |
| 2009/0140946 | A1 * | 6/2009 | Ziolkowski et al. | 343/788 |
| 2010/0109443 | A1 * | 5/2010 | Cook | H01Q 1/2225 307/104 |
| 2010/0148723 | A1 * | 6/2010 | Cook et al. | 320/108 |

FOREIGN PATENT DOCUMENTS

| | | |
|---|---|---|
| JP | 2000106510 A | 4/2000 |
| JP | 2000-245077 | 9/2000 |
| JP | 2002-049428 | 2/2002 |
| JP | 2002-152997 | 5/2002 |
| JP | 2004/520730 A | 7/2004 |
| JP | 2005039799 A | 2/2005 |
| JP | 2008504745 A | 2/2008 |
| JP | 2008-236917 | 10/2008 |
| KR | 10-2001-0022881 A | 3/2001 |
| KR | 10-2002-0021740 A | 3/2002 |
| KR | 10-2003-0003606 A | 1/2003 |
| KR | 10-2004-0080212 A | 9/2004 |
| WO | WO2010/014634 A2 | 2/2010 |
| WO | WO2010/028092 A1 | 3/2010 |

OTHER PUBLICATIONS

International Search Report mailed Apr. 27, 2012, issued in counterpart International Patent Application No. PCT/KR2011/006511; 3 pages in English.

Japanese Office Action issued by the Japanese Patent Office on May 26, 2015 for the corresponding Japanese Patent Application No. 2013/527019 (5 pages in English, 4 pages in Japanese).

\* cited by examiner

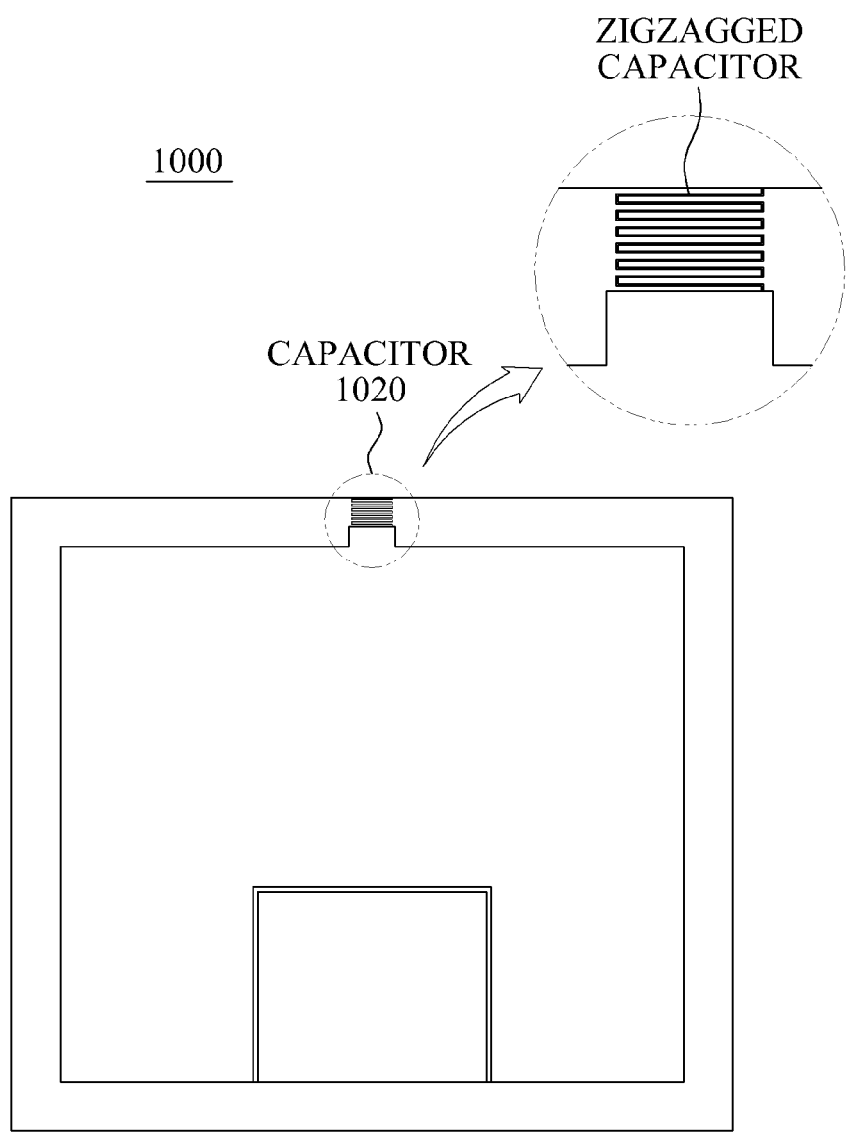

POWER CONVERTER IN RESONANCE POWER TRANSMISSION SYSTEM, AND RESONANCE POWER TRANSMISSION APPARATUS

CROSS-REFERENCE TO RELATED APPLICATION(S)

This application claims the benefit under 35 U.S.C. §119(a) of Korean Patent Application No. 10-2010-0085873, filed on Sep. 2, 2010, in the Korean Intellectual Property Office, the entire disclosure of which is incorporated herein by reference for all purposes.

BACKGROUND

1. Field

The following description relates to a power converter which may be used in wireless power transmission systems.

2. Description of Related Art

A resonance power transfer system may correspond to a type of a wireless power transmission system, and may include, a source device for wirelessly transmitting resonance power and a target device for receiving the resonance power. Due to the nature of a wireless environment, a scheme may be used to enhance power transmission efficiency and to reduce an effect on peripheral devices.

SUMMARY

According to an aspect, a power converter in a resonance power transmission system may include: an input end configured to receive a direct current (DC) voltage of a predetermined level; a first power converter configured to convert the DC voltage of a predetermined level to an alternating current (AC) signal using a first switching pulse signal having substantially the same frequency as a resonant frequency; a second power converter configured to convert the DC voltage of a predetermined level to an AC signal using a second switching pulse signal having an opposite phase to the first switching pulse signal; a first short circuit configured to reduce or eliminate an odd harmonic of the AC signal outputted from the first power converter, and to provide the AC signal where the odd harmonic is reduced or eliminated to a source resonator; and a second short circuit configured to reduce or eliminate an odd harmonic of the AC signal outputted from the second power converter, and to provide the AC signal where the odd harmonic is reduced or eliminated to the source resonator.

The resonant frequency may correspond to a range from about 2 to 20 MHz.

The AC signal outputted from the first short circuit may have an opposite phase to the AC signal outputted from the second short circuit.

The first short circuit may include a capacitor and an inductor, and values of the capacitor and the inductor may be determined based on a frequency of an odd harmonic component of the AC signal outputted from the first power converter.

The second short circuit may include a capacitor and an inductor, and values of the capacitor and the inductor may be determined based on a frequency of an odd harmonic component of the AC signal outputted from the second power converter.

According to another aspect, an apparatus for transmitting a resonance power may include: a voltage control unit configured to receive an input of an alternating current (AC) signal of a first frequency band, and to output a direct current (DC) voltage of a predetermined level; a first power converter configured to convert the DC voltage of a predetermined level to an AC power using a first switching pulse signal of a second frequency band; a second power converter configured to convert the DC voltage of a predetermined level to an AC signal using a second switching pulse signal having an opposite phase to the first switching pulse signal; a first short circuit configured to reduce or eliminate an odd harmonic of the AC signal outputted from the first power converter; a second short circuit configured to reduce or eliminate an odd harmonic of the AC signal outputted from the second power converter; and a source resonator configured to transfer an AC power, corresponding to an output signal of the first short circuit and the second short circuit, to a target resonator.

The first short circuit may include a capacitor and an inductor, and values of the capacitor and the inductor may be determined based on a frequency of an odd harmonic component of the AC signal outputted from the first power converter.

The second short circuit may include a capacitor and an inductor, and values of the capacitor and the inductor may be determined based on a frequency of an odd harmonic component of the AC signal outputted from the second power converter.

The source resonator may include: a transmission line including a first signal conducting portion, a second conducting portion, and a ground conducting portion corresponding to the first signal conducting portion and the second signal conducting portion; a first conductor configured to electrically connect the first signal conducting portion to the ground conducting portion; a second conductor configured to electrically connect the second signal conducting portion to the ground conducting portion; and at least one capacitor inserted between the first signal conducting portion and the second signal conducting portion in series with respect to a current flowing through the first signal conducting portion and the second signal conducting portion.

The source resonator may further include: a matcher, located inside a loop formed by the transmission line, the first conductor, and the second conductor, configured to adjust an impedance of the source resonator.

According to yet another aspect, a power converter may include: at least one power converter circuit configured to receive a first signal to output a second signal; and at least one harmonic eliminating circuit configured to reduce and/or eliminate an odd harmonic of the second signal.

The power converter circuit may include a switch. And the switch may be configured to receive a switching pulse signal.

The first signal may be direct current (DC) voltage of a predetermined level. And the second signal may be alternating current (AC).

The at least one harmonic eliminating circuit may include a capacitor and an inductor.

Values for the capacitor C and inductor L may be determined based on the frequency of the odd harmonic $f_{odd}$ according to the following equation:

$$LC = \frac{1}{(2\pi f_{odd})^2}.$$

The at least one power converter circuit may include two power converter circuits, wherein the two power converter circuits are driven at opposite phase to each other.

A resonance power transmission system may include the power converter. The resonance power transmission system may further include: a resonator device, wherein the impedance of at least one harmonic eliminating circuit is substantially the same as a resonator device.

Other features and aspects will be apparent from the following detailed description, the drawings, and the claims.

BRIEF DESCRIPTION OF THE DRAWINGS

FIG. 5 through FIG. 11 are diagrams illustrating various resonator structures.

Figure 1:
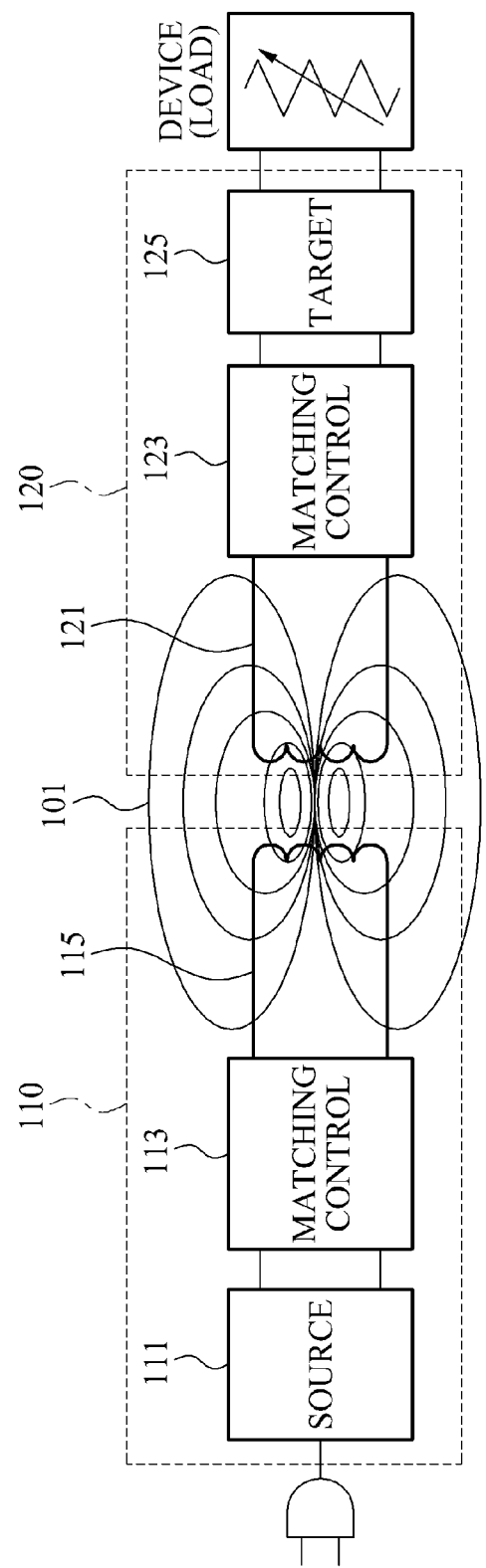
FIG. 1 is a diagram illustrating a wireless power transmission system.

Throughout the drawings and the detailed description, unless otherwise described, the same drawing reference numerals will be understood to refer to the same elements, features, and structures. The relative size and depiction of these elements may be exaggerated for clarity, illustration, and convenience.

DETAILED DESCRIPTION

The following detailed description is provided to assist the reader in gaining a comprehensive understanding of the methods, apparatuses, and/or systems described herein. Accordingly, various changes, modifications, and equivalents of the methods, apparatuses, and/or systems described herein will be suggested to those of ordinary skill in the art. The progression of processing steps and/or operations described is an example; however, the sequence of and/or operations is not limited to that set forth herein and may be changed as is known in the art, with the exception of steps and/or operations necessarily occurring in a certain order. Also, description of well-known functions and constructions may be omitted for increased clarity and conciseness.

FIG. 1 illustrates a wireless power transmission system.

In various embodiments, the wireless power transmitted using the wireless power transmission system may be resonance power.

As shown, the wireless power transmission system may have a source-target structure including a source and a target. For example, the wireless power transmission system may include a resonance power transmitter 110 corresponding to the source and a resonance power receiver 120 corresponding to the target.

The resonance power transmitter 110 may include a source unit 111 and a source resonator 115. The source unit 111 may be configured to receive energy from an external voltage supplier to generate a resonance power. In some instances, the resonance power transmitter 110 may further include a matching control 113 to perform resonance frequency and/or impedance matching.

The source unit 111 may include an alternating current (AC)-to-AC (AC/AC) converter, an AC-to-direct current (DC) (AC/DC) converter, and a (DC/AC) inverter. The AC/AC converter may be configured to adjust, to a desired level, a signal level of an AC signal input from an external device. The AC/DC converter may output a DC voltage at a predetermined level, for instance, by rectifying an AC signal output from the AC/AC converter. The DC/AC inverter may be configured to generate an AC signal (e.g., in a band of a few megahertz (MHz) to tens of MHz) by quickly switching a DC voltage output from the AC/DC converter. Other frequencies of AC are also possible.

The matching control 113 may be configured to set the resonance bandwidth of the source resonator 115, the impedance matching frequency of the source resonator 115, or both. In some implementations, the matching control 113 may include a source resonance bandwidth setting unit and/or a source matching frequency setting unit. The source resonance bandwidth setting unit may set the resonance bandwidth of the source resonator 115. And the source matching frequency setting unit may set the impedance matching frequency of the source resonator 115. For example, a Q-factor of the source resonator 115 may be determined based on setting of the resonance bandwidth of the source resonator 115 or setting of the impedance matching frequency of the source resonator 115.

The source resonator 115 may be configured to transfer electromagnetic energy to a target resonator 121. For example, the source resonator 115 may transfer the resonance power to the resonance power receiver 120 through magnetic coupling 101 with the target resonator 121. Accordingly, the source resonator 115 may be configured to resonate within the set resonance bandwidth.

As shown, the resonance power receiver 120 may include the target resonator 121, a matching control 123 to perform resonance frequency and/or impedance matching, and a target unit 125 to transfer the received resonance power to a device or a load.

The target resonator 121 may be configured to receive the electromagnetic energy from the source resonator 115. The target resonator 121 may be configured to resonate within the set resonance bandwidth.

The matching control 123 may set at least one of a resonance bandwidth of the target resonator 121 and an impedance matching frequency of the target resonator 121. In some instances, the matching control 123 may include a target resonance bandwidth setting unit, a target matching frequency setting unit, or both. The target resonance bandwidth setting unit may set the resonance bandwidth of the target resonator 121. The target matching frequency setting unit may set the impedance matching frequency of the target resonator 121. For example, a Q-factor of the target resonator 121 may be determined based on setting of the resonance bandwidth of the target resonator 121 and/or setting of the impedance matching frequency of the target resonator 121.

The target unit 125 may be configured to transfer the received resonance power to the device or load. The target unit 125 may include an AC/DC converter and a DC/DC converter. The AC/DC converter may generate a DC voltage by rectifying an AC signal transmitted from the source resonator 115 to the target resonator 121. And the DC/DC converter may supply a rated voltage to a device or the load by adjusting the voltage level of the DC voltage.

In one or more embodiments, the source resonator 115 and the target resonator 121 may be configured as a helix coil structured resonator, a spiral coil structured resonator, a meta-structured resonator, or the like.

Referring to FIG. 1, controlling the Q-factor may include setting the resonance bandwidth of the source resonator 115 and the resonance bandwidth of the target resonator 121, and transferring the electromagnetic energy from the source resonator 115 to the target resonator 121 through magnetic coupling 101 between the source resonator 115 and the target resonator 121. The resonance bandwidth of the source resonator 115 may be set to be wider or narrower than the resonance bandwidth of the target resonator 121 in some instances. For example, an unbalanced relationship between a BW-factor of the source resonator 115 and a BW-factor of the target resonator 121 may be maintained by setting the resonance bandwidth of the source resonator 115 to be wider or narrower than the resonance bandwidth of the target resonator 121.

For wireless power transmission employing a resonance scheme, the resonance bandwidth may be an important factor. When the Q-factor (e.g., considering a change in a distance between the source resonator 115 and the target resonator 121, a change in the resonance impedance, impedance mismatching, a reflected signal, and/or the like), is Qt, Qt to may have an inverse-proportional relationship with the resonance bandwidth, as given by Equation 1.

$$\frac{\Delta f}{f_0} = \frac{1}{Qt}$$ [Equation 1]
$$= \Gamma_{S,D} + \frac{1}{BW_S} + \frac{1}{BW_D}$$

In Equation 1, $f_0$ denotes a central frequency, $\Delta f$ denotes a change in a bandwidth, $\Gamma_{S,D}$ denotes a reflection loss between the source resonator 115 and the target resonator 121, $BW_S$ denotes the resonance bandwidth of the source resonator 115, and $BW_D$ denotes the resonance bandwidth of the target resonator 121. The BW-factor may indicate either $1/BW_S$ or $1/BW_D$.

Due to one or more external effects, for example, a change in the distance between the source resonator 115 and the target resonator 121, a change in a location of at least one of the source resonator 115 and the target resonator 121, and/or the like, impedance mismatching between the source resonator 115 and the target resonator 121 may occur. The impedance mismatching may be a direct cause in decreasing an efficiency of power transfer. When a reflected wave corresponding to a transmission signal that is partially reflected and returned is detected, the matching control 113 may be configured to determine the impedance mismatching has occurred, and may perform impedance matching. The matching control 113 may change the resonance frequency by detecting a resonance point through a waveform analysis of the reflected wave. The matching control 113 may determine, as the resonance frequency, a frequency having the minimum amplitude of the waveform of the reflected wave.

Figure 2:
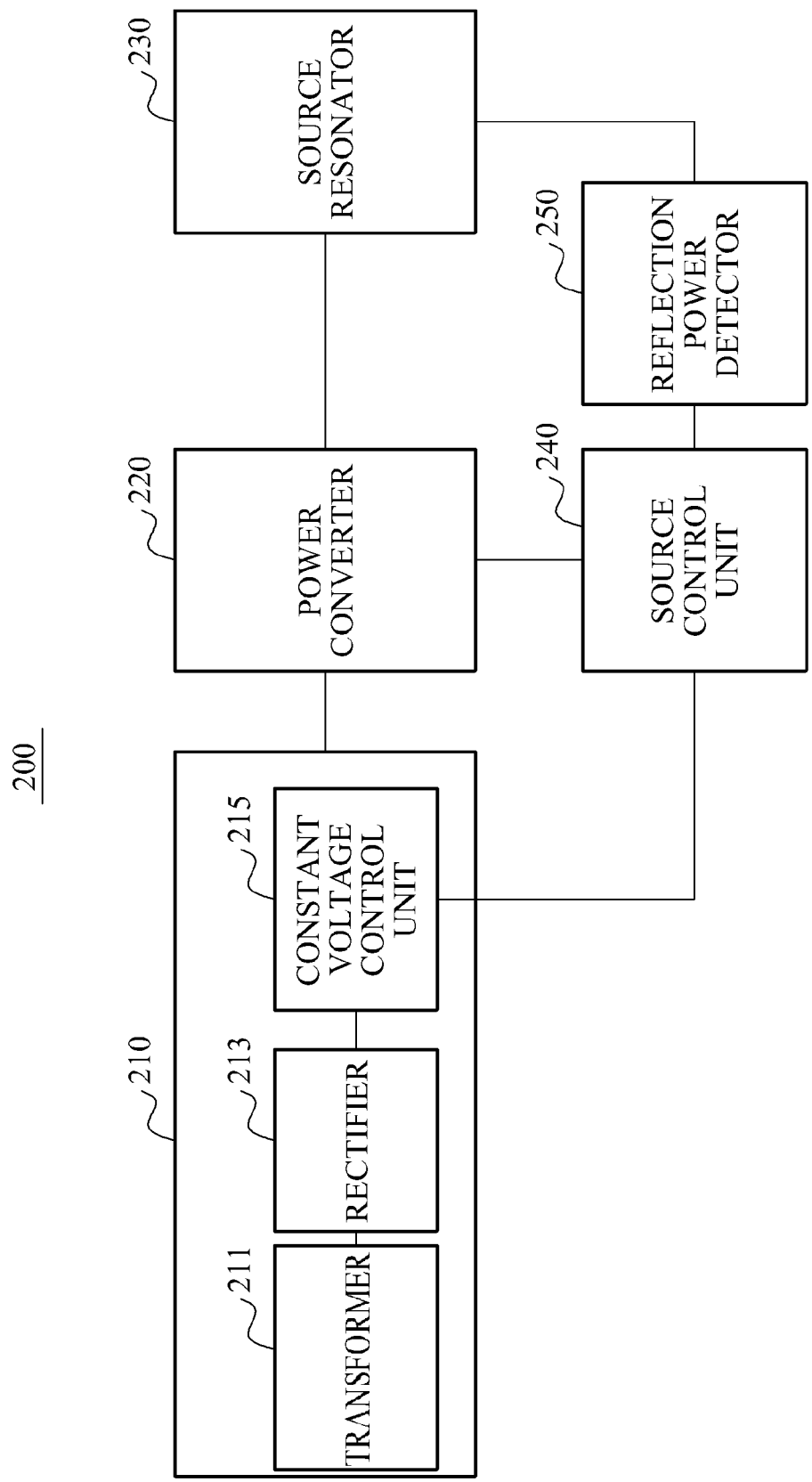
FIG. 2 is a diagram illustrating an apparatus for transmitting a resonance power.

FIG. 2 illustrates an apparatus for transmitting a resonance power 200.

As shown, the apparatus for transmitting a resonance power 200 may include a voltage control unit 210, a power converter 220, a source resonator 230, and a source control unit 240. In some embodiments, the apparatus for transmitting a resonance power 200 may further include a reflection power detector 250 and/or a communication unit.

The voltage control unit 210 may receive an input of an AC signal of a first frequency, and may output a DC voltage of a predetermined level. The first frequency may correspond to, for example, several tens of Hz. The AC signal of the first frequency may be generated by a fast switching scheme using a fast switching device, or may be generated by an oscillation scheme using an oscillator. The voltage control unit 210 may include a transformer 211, a rectifier 213, and a constant voltage control unit 215, as shown.

The transformer 211 may be configured to adjust a signal level of an AC signal inputted from an external device.

The rectifier 213 may rectify an AC signal outputted from the transformer 211, thereby outputting a DC signal.

The constant voltage control unit 215 may be configured to output a DC signal of a predetermined level according to a control of the source control unit 240. The constant voltage control unit 215 may include a stabilizing circuit for outputting the DC signal of a predetermined level. The voltage level of the DC voltage outputted from the constant voltage control unit 215 may be determined based on an amount of power used for a target device and a control of an amount of power of a resonance power.

The power converter 220 may convert the DC voltage of a predetermined level to an AC power using a switching pulse signal of a second frequency band. The second frequency band may correspond to a resonant frequency, and may correspond to a range of several MHz to several tens of MHz. For example, the second frequency band may correspond to a range of 2 to 20 MHz.

The source resonator 230 may transfer an AC power to an apparatus for receiving a resonance power by a magnetic coupling, for instance.

The source control unit 240 may control the signal level of a DC voltage outputted from the voltage control unit 210 based on a reflection power and a number of apparatuses for receiving a resonance power. The source control unit 240 may provide a switching pulse signal having the same frequency as the resonant frequency to the power converter 220.

The reflection power detector 250 may detect a reflection power corresponding to a resonance power transmitted to the apparatus for receiving a resonance power. The reflection power detector 250 may detect a reflection signal through a coupler, and may calculate a power of the detected reflection signal. When the reflection power is detected, the source control unit 240 may determine that the number of apparatuses for receiving a resonance power is reduced, and/or the distance between the source control unit 240 and the apparatus for receiving a resonance power increase.

The communication unit may perform an in-band communication for exchanging data with the apparatus for receiving a resonance power through resonant frequency, and an out-band communication for exchanging data with the apparatus for receiving resonance power through a different frequency assigned for a data communication.

Figure 3:
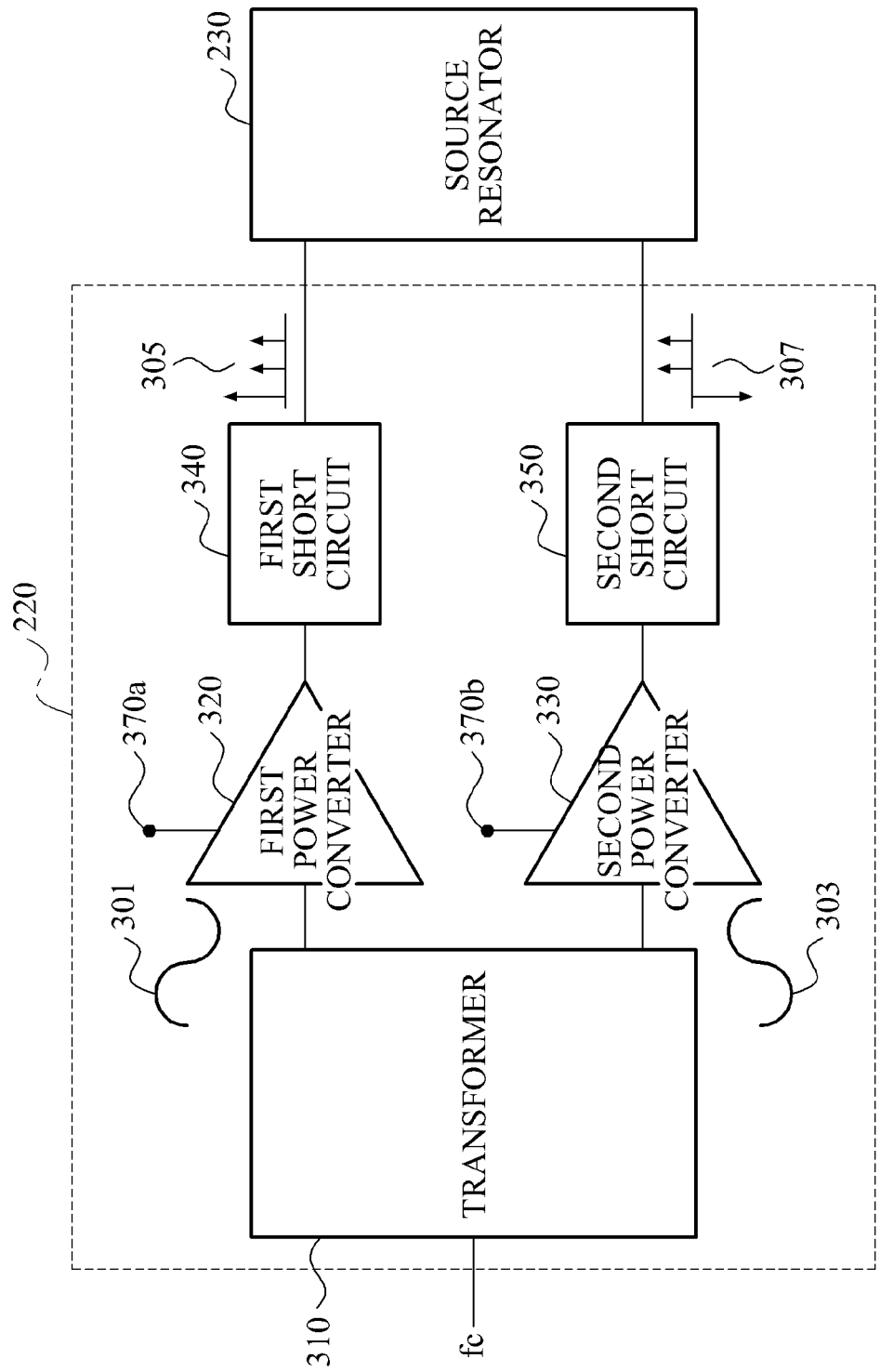
FIG. 3 is a diagram illustrating one configuration of a power converter of FIG. 2.

FIG. 3 illustrates one configuration of the power converter 220 of FIG. 2. In some embodiments, the power converter 220 may be configured to implement a push-pull scheme. In a push-pull scheme, a pair of power converters may be provided which are driven in opposite phase of each other. This scheme may a characteristic of a low harmonic. In addition, the push-pull scheme may reduce the magnitude of even harmonic(s) occurring during a power conversion.

However, odd harmonic(s) occurring during power conversion may not be effectively eliminated using only the push-pull scheme. Thus, the power converter 220 may include circuitry or other device configured to reduce and/or eliminate odd harmonic(s). This may in addition to be reducing or eliminating even harmonic(s), as described below.

As shown, the power converter 220 may include a transformer 310, a first power converter 320, a second power converter 330, a first short circuit 340, a second short circuit 350, and input ends 370a and 370b. The transformer 310 may be configured to receive an input signal, and may output a differential signal. In one or more embodiments, the transformer 310 may be a balun or other specialized type of transformer.

The transformer 310 may receive, as an input, a switching pulse signal fc having substantially the same frequency as the resonant frequency to be provided by the source resonator 230. Thus, the transformer 310 is configured to provide a first switching pulse signal 301 to the first power converter 320, and to provide a second switching pulse signal 303 to the second power converter 330. The second switching pulse signal 303 has the opposite phase as the first switching pulse signal 301.

In some implementations, the transformer 310 may also provide the first switching pulse signal 301 to the second power converter 330, and may provide the second switching pulse signal 303, having a phase opposite to the first switching pulse signal 301, to the first power converter 320.

The input ends 370a and 370b may provide DC voltage to the first power converter 320 and the second power converter 330. The DC voltage may be of a predetermined level. For example, the DC voltage may be the voltage signal output from the constant voltage control unit 215 of the voltage control unit 210 illustrated in FIG. 2.

The first power converter 320 may include an AC/DC inverter. The AC/DC inverter may convert the AC voltage to DC voltage using a switching pulse signal of a second frequency band. The AC/DC inverter may include a switching device. In one or more embodiments the switching device may enable fast switching. For instance, the switching device may be a transistor.

The first power converter 320 may convert the DC voltage of a predetermined level to an AC signal using the first switching pulse signal 301 having the same frequency as the resonant frequency. For instance, the switching device may be configured to be turned ON when the switching pulse signal fc is at a high state (e.g., at or near its maximum), and to be turned OFF when the switching pulse signal fc is at a low state (e.g., at or near its minimum). Other switching techniques may also be used.

Similarly, the second power converter 330 may also include an AC/DC inverter. The second power converter 330 may convert the DC voltage to an AC signal using the second switching pulse signal 303 having a phase opposite to the first switching pulse signal 301.

The first short circuit 340 may eliminate an odd harmonic of the AC signal outputted from the first power converter 320, and may provide an AC signal 305 where the odd harmonic is eliminated to the source resonator 230. Likewise, the second short circuit 350 may eliminate an odd harmonic of the AC signal outputted from the second power converter 330, and may provide an AC signal 307 where the odd harmonic is eliminated to the source resonator 230. Since the phase of the first and second switching pulse signals 301 and 303 are opposite to each other, the AC signal outputted 305 from the first short circuit 340 will have a phase opposite to the AC signal outputted 307 from the second short circuit 350. The power converter 200 of FIG. 2 does not need use a transformer for converting a differential signal to a single signal, in all embodiments. For instance, since the source resonator 230 may be configured to receive the differential signal, the transformer may not be necessary in all embodiments. The omission of transformer in the power converter 200, in some instances, may reduce a power loss associated with a transformer.

In FIG. 3, an output signal 305 of the first short circuit 340 may be expressed by "fc+fc2+fc3+ . . . ", and an output signal 307 of the second short circuit 350 may be expressed by "−fc+fc2−fc3+ . . . ." The signal level of the third harmonic "fc3" may be substantially zero ("0") or significantly small in magnitude in some instances. The AC signals 305 and 307 may be combined and provided to the source resonator 230. For instance, the AC signal outputted through the source resonator 230 may be expressed by "2fc+2fc3." The fundamental frequency fc has been essentially cancelled by using opposite phases for the first and second switching pulse signals 301 and 303.

Since the signal level for the third harmonic "fc3" may be significantly small in magnitude due to the first short circuit 340 and/or the second short circuit 350, the third (or other odd) harmonic of the AC signal outputted through the source resonator 230 may become extremely small and thus, negligible. Even harmonics included in the output signal 305 of the first short circuit 340 and the output signal 307 of the second short circuit 350 may be attenuated in the source resonator 230, for instance, using a push-pull scheme as discussed above.

Figure 4:
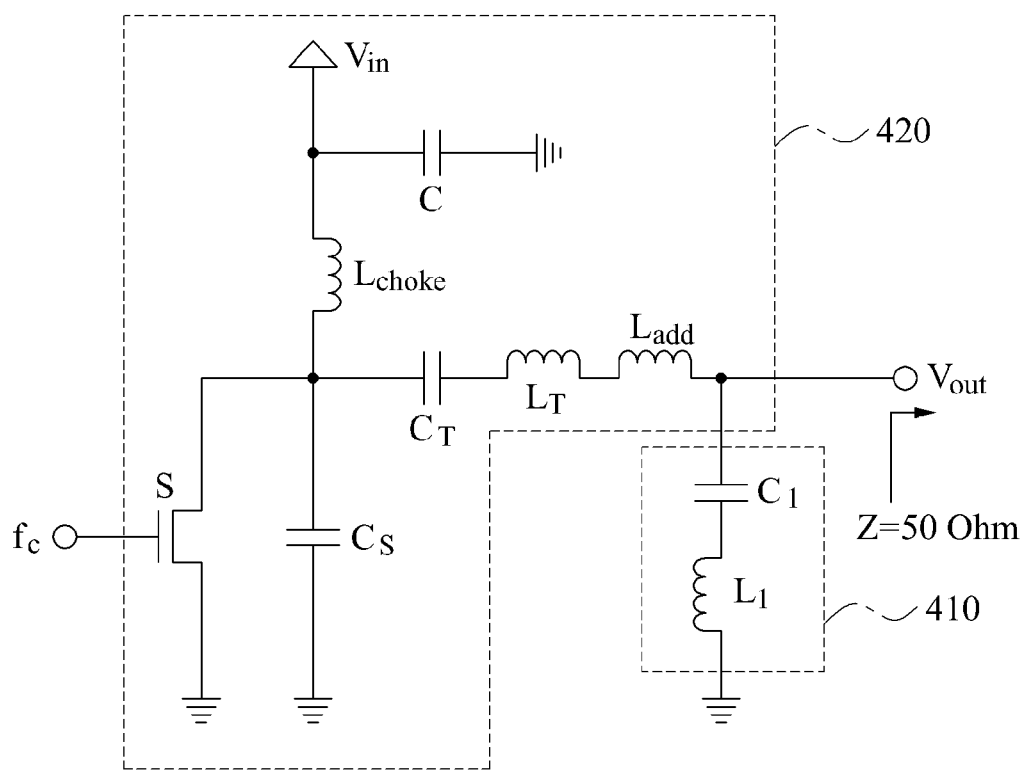
FIG. 4 is a diagram illustrating one equivalent circuit of a first power converter and a first short circuit of FIG. 3.

FIG. 4 illustrates an equivalent circuit including a short circuit 410 and a power converter circuit 420. The short circuit 410 may also be referred to as a harmonic eliminating circuit.

In some embodiments, the power converter circuit 420 and the short circuit 410 may correspond to the first and second power converters 320 and 330 and the first and second short circuits 340 and 350, respectively, as illustrated in FIG. 3.

As shown, the power converter circuit 420 may include a switching device S, a plurality of capacitors C, $C_S$ and $C_T$ and inductors $L_{choke}$, $L_T$ and $L_{add}$. The switching device S may be a transistor, such as a MOSFET, for example. The other elements may be part of a switched power regulator circuit for enhanced power efficiency.

The power converter circuit 420 receives DC voltage $V_{in}$ and output AC voltage $V_{out}$. The DC voltage $V_{in}$ may be of a predetermined level. For example, the DC voltage $V_{in}$ may be the voltage signal output from the constant voltage control unit 215 of the voltage control unit 210 illustrated in FIG. 2.

The short circuit 410 may be configured to reduce and/or eliminate an odd harmonic from the output AC voltage $V_{out}$. Also, as shown, the short circuit 410 may include a capacitor $C_1$ and an inductor $L_1$. For instance, for the frequency of a third harmonic component $f_{3rd}$ of the AC signal outputted from the short circuit 410, values of the capacitor $C_1$ and the inductor $L_1$ may be determined based on the following Equation 2.

$$L_1 C_1 = \frac{1}{(2\pi f_{3rd})^2} \quad \text{[Equation 2]}$$

When values of the capacitor $C_1$ and the inductor $L_1$ satisfy Equation 2 for the third harmonic frequency $f_{3rd}$, the third harmonic of a signal outputted from the power converter circuit 420 will be shunted or shorted to ground. Assuming that the impedance Z of the short circuit 410 and the source resonator 230 is 50 ohms, values of the capacitor $C_1$ and the inductor $L_1$ may be determined based on matching the impedance Z of the short circuit 410 and the source resonator 230. According to the configuration of FIG. 4, the impedance of the short circuit 410 and the source resonator 230 may be matched while an odd harmonic component is reduced and/or eliminated from the output signal $V_{out}$.

Values for the capacitor $C_1$ and the inductor $L_1$ may be similarly determined for other odd harmonics using Equation 2.

The circuit of FIG. 4 may correspond to an equivalent circuit of the first power converter 320 and the first short circuit 340. Thus, the first short circuit 340 may include the capacitor $C_1$ and the inductor $L_1$, and values of the capacitor $C_1$ and the inductor $L_1$ may be each determined based on a frequency of an odd harmonic component of an AC signal outputted from the first power converter 320. Similarly, the circuit of FIG. 4 may be similarly applied to the second power converter 330 and/or the second short circuit 350, respectively. In one embodiment, the second short circuit 350 may include a capacitor $C_2$ and an inductor $L_2$, and values of the capacitor $C_2$ and the inductor $L_2$ may be each determined based on a frequency of an odd harmonic component of an AC signal outputted from the second power converter 330.

By using a high efficiency power converter odd harmonic(s) may be prevented from occurring. This may be effective for resonance power transmission. Thus, an influence on other electronic devices in a resonance power transmission system may be reduced. And by preventing an occurrence of a harmonic, higher efficiency resonance power transmission system may be realized.

Referring again to FIG. 1, the source resonator 115 and/or the target resonator 121 may be configured as a helix coil structured resonator, a spiral coil structured resonator, a meta-structured resonator, and the like.

An electromagnetic characteristic of many materials found in nature is that they have a unique magnetic permeability or a unique permittivity. Most materials typically have a positive magnetic permeability or a positive permittivity. Thus, for these materials, a right hand rule may be applied to an electric field, a magnetic field, and a pointing vector and thus, the corresponding materials may be referred to as right handed materials (RHMs).

On the other hand, a material having a magnetic permeability or a permittivity which is not ordinarily found in nature or is artificially-designed (or man-made) may be referred to herein as a "metamaterial." Metamaterials may be classified into an epsilon negative (ENG) material, a mu negative (MNG) material, a double negative (DNG) material, a negative refractive index (NRI) material, a left-handed (LH) material, and the like, based on a sign of the corresponding permittivity or magnetic permeability.

The magnetic permeability may indicate a ratio between a magnetic flux density occurring with respect to a given magnetic field in a corresponding material and a magnetic flux density occurring with respect to the given magnetic field in a vacuum state. The magnetic permeability and the permittivity may determine a propagation constant of a corresponding material in a given frequency or a given wavelength. An electromagnetic characteristic of the corresponding material may be determined based on the magnetic permeability and the permittivity. According to an aspect, the metamaterial may be easily disposed in a resonance state without significant material size changes. This may be practical for a relatively large wavelength area or a relatively low frequency area.

Figure 5:
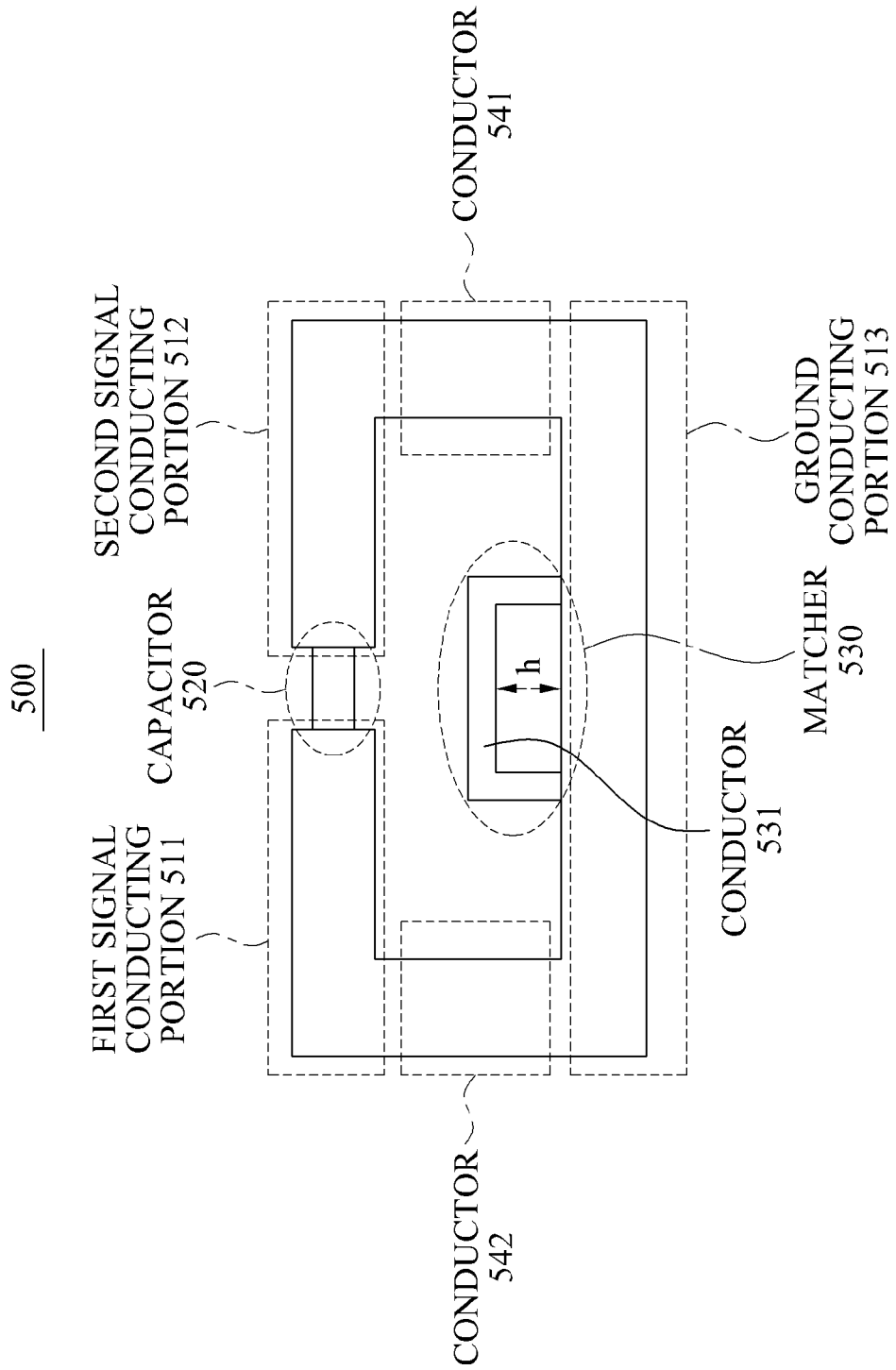

FIG. 5 illustrates a resonator 500 having a two-dimensional (2D) structure.

As shown, the resonator 500 having the 2D structure may include a transmission line, a capacitor 520, a matcher 530, and conductors 541 and 542. The transmission line may include, for instance, a first signal conducting portion 511, a second signal conducting portion 512, and a ground conducting portion 513.

The capacitor 520 may be inserted or otherwise positioned in series between the first signal conducting portion 511 and the second signal conducting portion 512 so that an electric field may be confined within the capacitor 520. In various implementations, the transmission line may include at least one conductor in an upper portion of the transmission line, and may also include at least one conductor in a lower portion of the transmission line. Current may flow through the at least one conductor disposed in the upper portion of the transmission line and the at least one conductor disposed in the lower portion of the transmission may be electrically grounded. As shown in FIG. 5, the resonator 500 may be configured to have a generally 2D structure. The transmission line may include the first signal conducting portion 511 and the second signal conducting portion 512 in the upper portion of the transmission line, and may include the ground conducting portion 513 in the lower portion of the transmission line. As shown, the first signal conducting portion 511 and the second signal conducting portion 512 may be disposed to face the ground conducting portion 513 with current flowing through the first signal conducting portion 511 and the second signal conducting portion 512.

In some implementations, one end of the first signal conducting portion 511 may be electrically connected (i.e., shorted to the conductor 542, and another end of the first signal conducting portion 511 may be connected to the capacitor 520. One end of the second signal conducting portion 512 may be grounded to the conductor 541, and another end of the second signal conducting portion 512 may be connected to the capacitor 520. Accordingly, the first signal conducting portion 511, the second signal conducting portion 512, the ground conducting portion 513, and the conductors 541 and 542 may be connected to each other such that the resonator 500 may have an electrically "closed-loop structure." The term "closed-loop structure" as used herein, may include a polygonal structure, for example, a circular structure, a rectangular structure, or the like that is electrically closed. The capacitor 520 may be inserted into an intermediate portion of the transmission line. For instance, the capacitor 520 may be inserted into a space between the first signal conducting portion 511 and the second signal conducting portion 512. The capacitor 520 may be configured, in some instance, as a lumped element, a distributed element, and/or the like. For example, a distributed capacitor may be configured as a distributed element and may include zigzagged conductor lines and a dielectric material having a relatively high permittivity between the zigzagged conductor lines.

When the capacitor 520 is inserted into the transmission line, the resonator 500 may have a property of a metamaterial, as discussed above. For example, the resonator 500 may have a negative magnetic permeability due to the capacitance of the capacitor 520. If so, the resonator 500 may also be referred to as a mu negative (MNG) resonator. Various criteria may be applied to determine the capacitance of the capacitor 520. For example, the various criteria for enabling the resonator 500 to have the characteristic of the metamaterial may include one or more of the following: a criterion for enabling the resonator 500 to have a negative magnetic permeability in a target frequency, a criterion for enabling the resonator 500 to have a zeroth order resonance characteristic in the target frequency, or the like.

The resonator 500, which may also be referred to as the MNG resonator 500, may also have a zeroth order resonance characteristic (i.e., having, as a resonance frequency, a frequency when a propagation constant is "0"). If the resonator 500 has a zeroth order resonance characteristic, the resonance frequency may be independent with respect to a physical size of the MNG resonator 500. Moreover, by appropriately designing (or configuring) the capacitor 520, the MNG resonator 500 may sufficiently change the resonance frequency without substantially changing the physical size of the MNG resonator 500.

In a near field, for instance, the electric field may be concentrated on the capacitor 520 inserted into the transmission line. Accordingly, due to the capacitor 520, the magnetic field may become dominant in the near field. In one or more embodiments, the MNG resonator 500 may have a relatively high Q-factor using the capacitor 520 of the lumped element. Thus, it may be possible to enhance power transmission efficiency. For example, the Q-factor indicates a level of an ohmic loss or a ratio of a reactance with respect to a resistance in the wireless power transmission. The efficiency of the wireless power transmission may increase according to an increase in the Q-factor.

The MNG resonator 500 may include a matcher 530 for impedance matching. The matcher 530 may be configured to appropriately determine and adjust the strength of the magnetic field of the MNG resonator 500. Depending on the configuration, current may flow in the MNG resonator 500 via a connector, or may flow out from the MNG resonator 500 via the connector. The connector may be connected to the ground conducting portion 513 or the matcher 530. In some instances, the power may be transferred through coupling without using a physical connection between the connector and the ground conducting portion 513 or the matcher 530.

As shown in FIG. 5, the matcher 530 may be positioned within the loop formed by the loop structure of the resonator 500. The matcher 530 may be configured to adjust the impedance of the resonator 500 by changing the physical shape of the matcher 530. For example, the matcher 530 may include the conductor 531 for the impedance matching positioned in a location that is separate from the ground conducting portion 513 by a distance h. The impedance of the resonator 500 may be changed by adjusting the distance h.

In some instances, a controller may be provided to control the matcher 530 which generates and transmits a control signal the matcher 530 directing the matcher to change its physical shape so that the impedance of the resonator may be adjusted. For example, the distance h between the conductor 531 of the matcher 530 and the ground conducting portion 513 may increase or decrease based on the control signal. The controller may generate the control signal based on various factors.

As shown in FIG. 5, the matcher 530 may be configured as a passive element such as the conductor 531, for example. Of course, in other embodiments, the matcher 530 may be configured as an active element such as a diode, a transistor, or the like. If the active element is included in the matcher 530, the active element may be driven based on the control signal generated by the controller, and the impedance of the resonator 500 may be adjusted based on the control signal. For example, when the active element is a diode included in the matcher 530 the impedance of the resonator 500 may be adjusted depending on whether the diode is in an ON state or in an OFF state.

In some instances, a magnetic core may be further provided to pass through the MNG resonator 500. The magnetic core may perform a function of increasing a power transmission distance.

Figure 6:
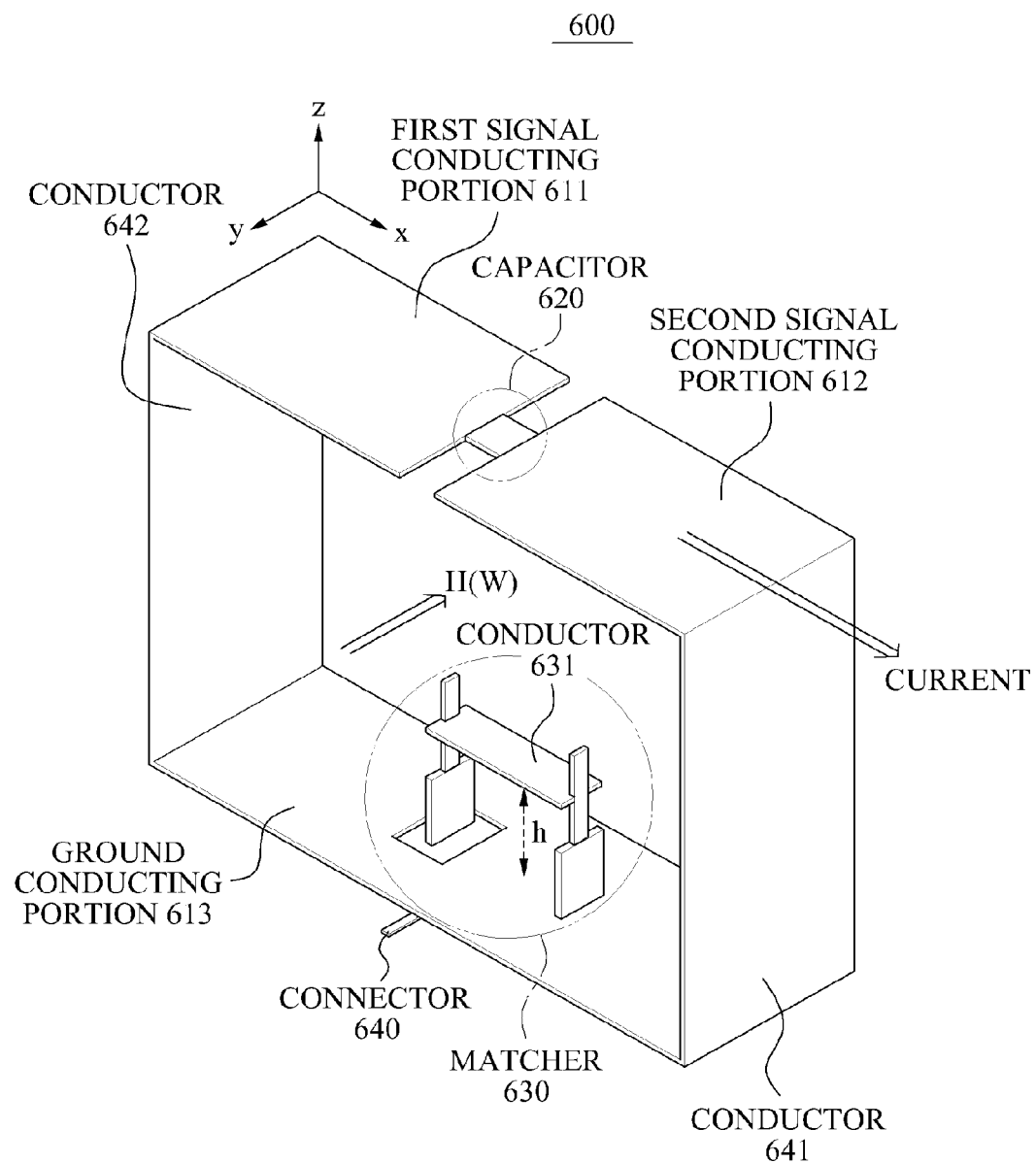

FIG. 6 illustrates a resonator 600 having a three-dimensional (3D) structure.

Referring to FIG. 6, the resonator 600 having the 3D structure may include a transmission line and a capacitor 620. The transmission line may include a first signal conducting portion 611, a second signal conducting portion 612, and a ground conducting portion 613. The capacitor 620 may be inserted, for instance, in series between the first signal conducting portion 611 and the second signal conducting portion 612 of the transmission link, such that an electric field may be confined within the capacitor 620.

As shown in FIG. 6, the resonator 600 may have a generally 3D structure. The transmission line may include the first signal conducting portion 611 and the second signal conducting portion 612 in an upper portion of the resonator 600, and may include the ground conducting portion 613 in a lower portion of the resonator 600. The first signal conducting portion 611 and the second signal conducting portion 612 may be disposed to face the ground conducting portion 613. In this arrangement, current may flow in an x direction through the first signal conducting portion 611 and the second signal conducting portion 612. Due to the current, a magnetic field H(W) may be formed in a −y (negative y) direction. However, it will be appreciated that the magnetic field H(W) might also be formed in other directions (e.g., a +y (positive y) direction) in some implementations.

In one or more embodiments, one end of the first signal conducting portion 611 may be electrically connected (i.e., shorted) to the conductor 642, and another end of the first signal conducting portion 611 may be connected to the capacitor 620. One end of the second signal conducting portion 612 may be grounded to the conductor 641, and another end of the second signal conducting portion 612 may be connected to the capacitor 620. Accordingly, the first signal conducting portion 611, the second signal conducting portion 612, the ground conducting portion 613, and the conductors 641 and 642 may be connected to each other, whereby the resonator 600 may have an electrically closed-loop structure.

As shown in FIG. 6, the capacitor 620 may be inserted or otherwise positioned between the first signal conducting portion 611 and the second signal conducting portion 612. For example, the capacitor 620 may be inserted into a space between the first signal conducting portion 611 and the second signal conducting portion 612. The capacitor 620 may be, for example, a lumped element, a distributed element, and the like. In one implementation, a distributed capacitor configured as a distributed element may include zigzagged conductor lines and a dielectric material having a relatively high permittivity between the zigzagged conductor lines.

When the capacitor 620 is inserted into the transmission line, the resonator 600 may have a property of a metamaterial.

For example, when the capacitance of the capacitor configured as the lumped element is appropriately determined, the resonator 600 may have the characteristic of the metamaterial. And when the resonator 600 has a negative magnetic permeability by appropriately adjusting the capacitance of the capacitor 620, the resonator 600 may also be referred to as an MNG resonator. Various criteria may be applied to determine the capacitance of the capacitor 620. For example, the criteria may include one or more of the following: a criterion for enabling the resonator 600 to have the characteristic of the metamaterial, a criterion for enabling the resonator 600 to have a negative magnetic permeability in a target frequency, a criterion enabling the resonator 600 to have a zeroth order resonance characteristic in the target frequency, or the like. Based on at least one criterion among the aforementioned criteria, the capacitance of the capacitor 620 may be determined.

The resonator 600, which may also be referred to as the MNG resonator 600, may have a zeroth order resonance characteristic (i.e., having, as a resonance frequency, a frequency when a propagation constant is "0"). If the resonator 600 has a zeroth order resonance characteristic, the resonance frequency may be independent with respect to a physical size of the MNG resonator 600. Thus, by appropriately designing (or configuring) the capacitor 620, the MNG resonator 600 may sufficiently change the resonance frequency without changing the physical size of the MNG resonator 600.

Referring to the MNG resonator 600 of FIG. 6, in a near field, the electric field may be concentrated on the capacitor 620 inserted into the transmission line. Accordingly, due to the capacitor 620, the magnetic field may become dominant in the near field. And, since the MNG resonator 600 having the zeroth-order resonance characteristic may have characteristics similar to a magnetic dipole, the magnetic field may become dominant in the near field. A relatively small amount of the electric field formed due to the insertion of the capacitor 620 may be concentrated on the capacitor 620 and thus, the magnetic field may become further dominant.

Also, the MNG resonator 600 may include the matcher 630 for impedance matching. The matcher 630 may be configured to appropriately adjust the strength of magnetic field of the MNG resonator 600. The impedance of the MNG resonator 600 may be determined by the matcher 630. In one or more embodiments, current may flow in the MNG resonator 600 via a connector 640, or may flow out from the MNG resonator 600 via the connector 640. And the connector 640 may be connected to the ground conducting portion 613 or the matcher 630.

As shown in FIG. 6, the matcher 630 may be positioned within the loop formed by the loop structure of the resonator 600. The matcher 630 may be configured to adjust the impedance of the resonator 600 by changing the physical shape of the matcher 630. For example, the matcher 630 may include the conductor 631 for the impedance matching in a location separate from the ground conducting portion 613 by a distance h. The impedance of the resonator 600 may be changed by adjusting the distance h.

In some implementations, a controller may be provided to control the matcher 630. In this case, the matcher 630 may change the physical shape of the matcher 630 based on a control signal generated by the controller. For example, the distance h between the conductor 631 of the matcher 630 and the ground conducting portion 613 may be increased or decreased based on the control signal. Accordingly, the physical shape of the matcher 630 may be changed such that the impedance of the resonator 600 may be adjusted. The distance h between the conductor 631 of the matcher 630 and the ground conducting portion 613 may be adjusted using a variety of schemes. Alternatively or additionally, a plurality of conductors may be included in the matcher 630 and the distance h may be adjusted by adaptively activating one of the conductors. As another example, the distance h may be adjusted by adjusting the physical location of the conductor 631 up and down. For instance, the distance h may be controlled based on the control signal of the controller. The controller may generate the control signal using various factors. As shown in FIG. 6, the matcher 630 may be configured as a passive element such as the conductor 631, for instance. Of course, in other embodiments, the matcher 630 may be configured as an active element such as a diode, a transistor, or the like. When the active element is included in the matcher 630, the active element may be driven based on the control signal generated by the controller, and the impedance of the resonator 600 may be adjusted based on the control signal. For example, if the active element is a diode included in the matcher 630, the impedance of the resonator 600 may be adjusted depending on whether the diode is in an ON state or in an OFF state.

In some implementations, a magnetic core may be further provided to pass through the resonator 600 configured as the MNG resonator. The magnetic core may perform a function of increasing a power transmission distance.

Figure 7:
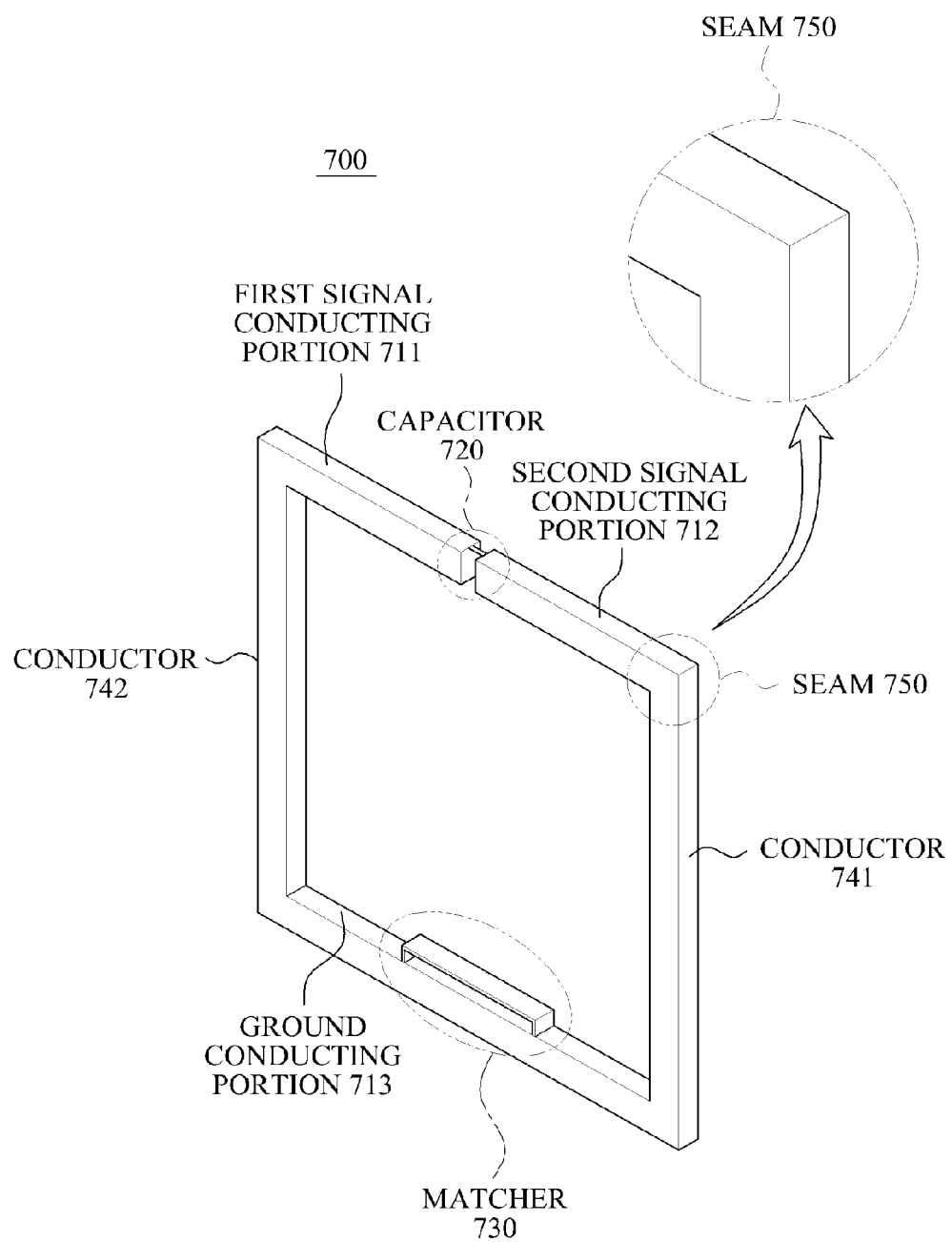

FIG. 7 illustrates a resonator 700 for a wireless power transmission configured as a bulky type. As used herein, the term "bulky type" may refer to a seamless connection connecting at least two parts in an integrated form. As shown, a first signal conducting portion 711 and a second signal conducting portion 712 may be integrally formed instead of being separately manufactured and thereby be connected to each other. Similarly, the second signal conducting portion 712 and the conductor 741 may also be integrally manufactured.

When the second signal conducting portion 712 and the conductor 741 are separately manufactured and then are connected to each other, a loss of conduction may occur due to a seam 750. Thus, in some implementations, the second signal conducting portion 712 and the conductor 741 may be connected to each other without using a separate seam (i.e., seamlessly connected to each other). Accordingly, it may be possible to decrease a conductor loss caused by the seam 750. For instance, the second signal conducting portion 712 and the ground conducting portion 713 may be seamlessly and integrally manufactured. Similarly, the first signal conducting portion 711, the conductor 742 and the ground conducting portion 713 may be seamlessly and integrally manufactured.

A matcher 730 may be provided that is similarly constructed as described herein in one or more embodiments.

Figure 8:
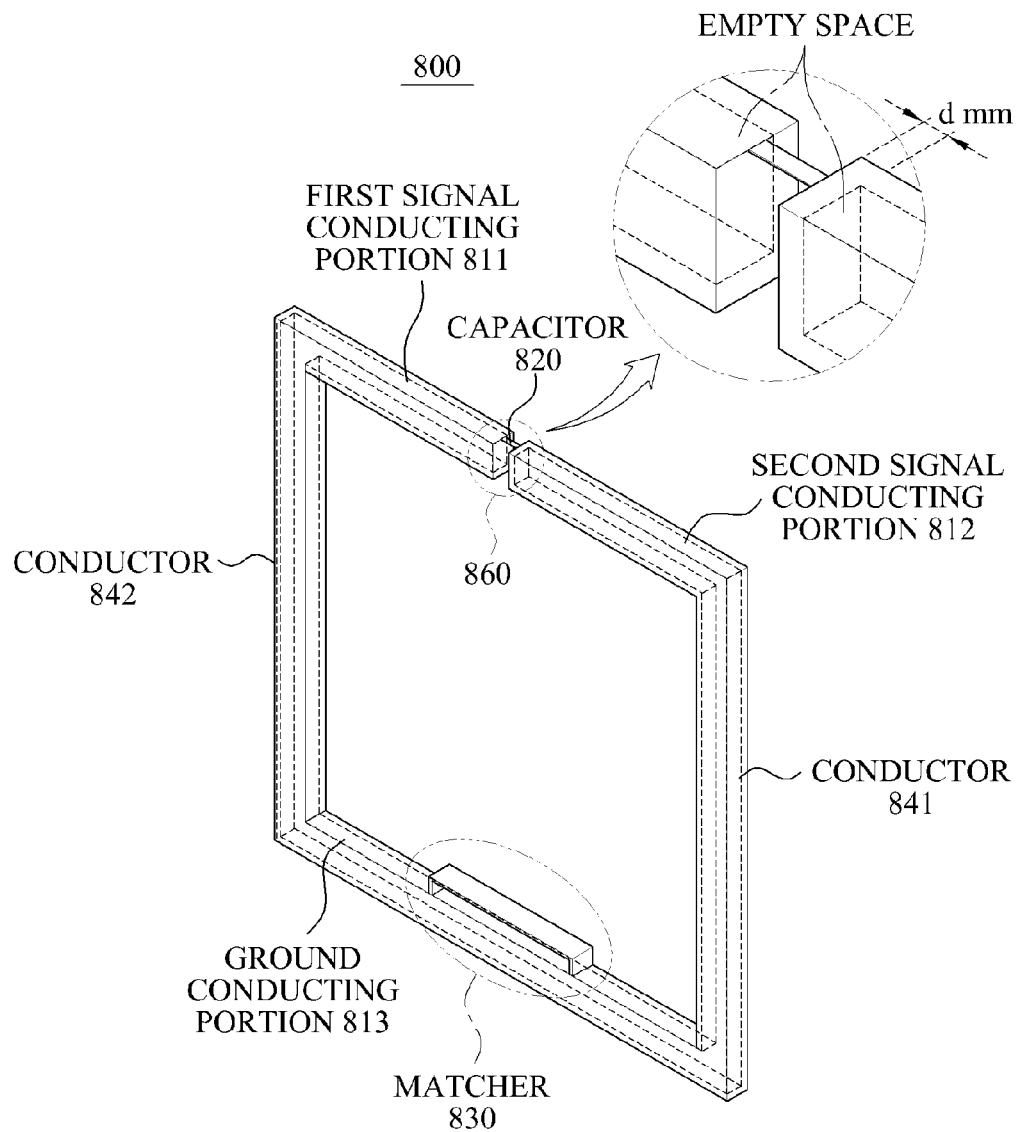

FIG. 8 illustrates a resonator 800 for a wireless power transmission, configured as a hollow type.

Referring to FIG. 8, one or more of a first signal conducting portion 811, a second signal conducting portion 812, a ground conducting portion 813, and conductors 841 and 842 of the resonator 800 configured as the hollow type structure. As used herein the term "hollow type" refers to a configuration that may include an empty space inside.

For a given resonance frequency, an active current may be modeled to flow in only a portion of the first signal conducting portion 811 instead of all of the first signal conducting portion 811, a portion of the second signal conducting portion 812 instead of all of the second signal conducting portion 812, a portion of the ground conducting portion 813 instead of all of the ground conducting portion 813, and a portion of the conductors 841 and 842 instead of all of the conductors 841 and 842. When a depth of each of the first signal conducting portion 811, the second signal conducting portion 812, the ground conducting portion 813, and the conductors 841 and 842 is significantly deeper than a corresponding skin depth in the given resonance frequency, it may be ineffective. The significantly deeper depth may, however, increase the weight or the manufacturing costs of the resonator 800 in some instances.

Accordingly, for the given resonance frequency, the depth of each of the first signal conducting portion 811, the second signal conducting portion 812, the ground conducting portion 813, and the conductors 841 and 842 may be appropriately determined based on the corresponding skin depth of each of the first signal conducting portion 811, the second signal conducting portion 812, the ground conducting portion 813, and the conductors 841 and 842. When each of the first signal conducting portion 811, the second signal conducting portion 812, the ground conducting portion 813, and the conductors 841 and 842 has an appropriate depth deeper than a corresponding skin depth, the resonator 800 may become lighter, and manufacturing costs of the resonator 800 may also decrease.

For example, as shown in FIG. 8, the depth of the second signal conducting portion 812 (as further illustrated in the enlarged view region 860 indicated by a circle) may be determined as "d" mm and d may be determined according to $$d = \frac{1}{\sqrt{\pi f \mu \sigma}}.$$

Here, f denotes a frequency, μ denotes a magnetic permeability, and σ denotes a conductor constant. In one embodiment, when the first signal conducting portion 811, the second signal conducting portion 812, the ground conducting portion 813, and the conductors 841 and 842 are made of a copper and they may have a conductivity of $5.8 \times 10^7$ siemens per meter ($S \cdot m^{-1}$), the skin depth may be about 0.6 mm with respect to 10 kHz of the resonance frequency and the skin depth may be about 0.006 mm with respect to 100 MHz of the resonance frequency.

A capacitor 820 and a matcher 830 may be provided that are similarly constructed as described herein in one or more embodiments.

Figure 9:
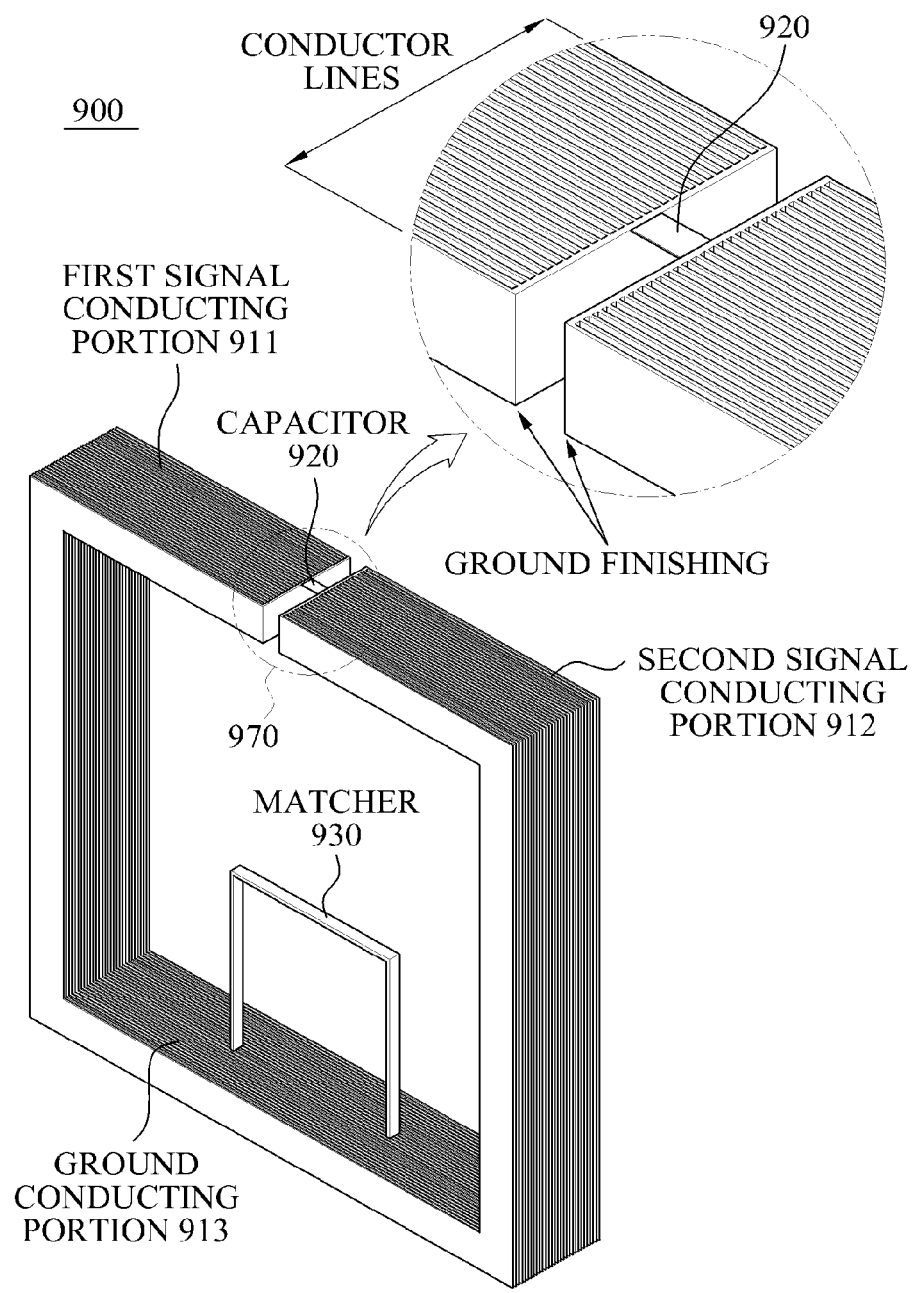

FIG. 9 illustrates a resonator 900 for a wireless power transmission using a parallel-sheet.

Referring to FIG. 9, the parallel-sheet may be applicable to each of a first signal conducting portion 911 and a second signal conducting portion 912 included in the resonator 900.

One or both of the first signal conducting portion 911 and the second signal conducting portion 912 may not be a perfect conductor and thus, may have an inherent resistance. Due to this resistance, an ohmic loss may occur. The ohmic loss may decrease a Q-factor and also decrease a coupling effect.

By applying the parallel-sheet to the first signal conducting portion 911 and the second signal conducting portion 912, it may be possible to decrease the ohmic loss, and to increase the Q-factor and the coupling effect. Referring to the enlarged view portion 920 indicated by a circle, when the parallel-sheet is applied, each of the first signal conducting portion 911 and the second signal conducting portion 912 may include a plurality of conductor lines. The plurality of conductor lines may be disposed in parallel, and may be electrically connected (i.e., shorted) at an end portion of each of the first signal conducting portion 911 and the second signal conducting portion 912.

When the parallel-sheet is applied to each of the first signal conducting portion 911 and the second signal conducting portion 912, the plurality of conductor lines may be disposed in parallel. Accordingly, a sum of resistances having the conductor lines may decrease. Consequently, the resistance loss may decrease, and the Q-factor and the coupling effect may increase.

A capacitor 920 and a matcher 930 positioned on the ground conducting portion 913 may be provided that are similarly constructed as described herein in one or more embodiments.

FIG. 10 illustrates a resonator 1000 for a wireless power transmission, including a distributed capacitor.

Referring to FIG. 10, a capacitor 1020 included in the resonator 1000 is configured for the wireless power transmission. A capacitor as a lumped element may have a relatively high equivalent series resistance (ESR). A variety of schemes have been proposed to decrease the ESR contained in the capacitor of the lumped element. According to an embodiment, by using the capacitor 1020 as a distributed element, it may be possible to decrease the ESR. As will be appreciated, a loss caused by the ESR may decrease a Q-factor and a coupling effect.

As shown in FIG. 10, the capacitor 1020 may be configured as a conductive line having the zigzagged structure.

By employing the capacitor 1020 as the distributed element, it is possible to decrease the loss occurring due to the ESR in some instances. In addition, by disposing a plurality of capacitors as lumped elements, it may be possible to decrease the loss occurring due to the ESR. Since a resistance of each of the capacitors as the lumped elements decreases through a parallel connection, active resistances of parallel-connected capacitors as the lumped elements may also decrease whereby the loss occurring due to the ESR may decrease. For example, by employing ten capacitors of 1 pF each instead of using a single capacitor of 10 pF, it may be possible to decrease the loss occurring due to the ESR in some instances.

Figure 11A:
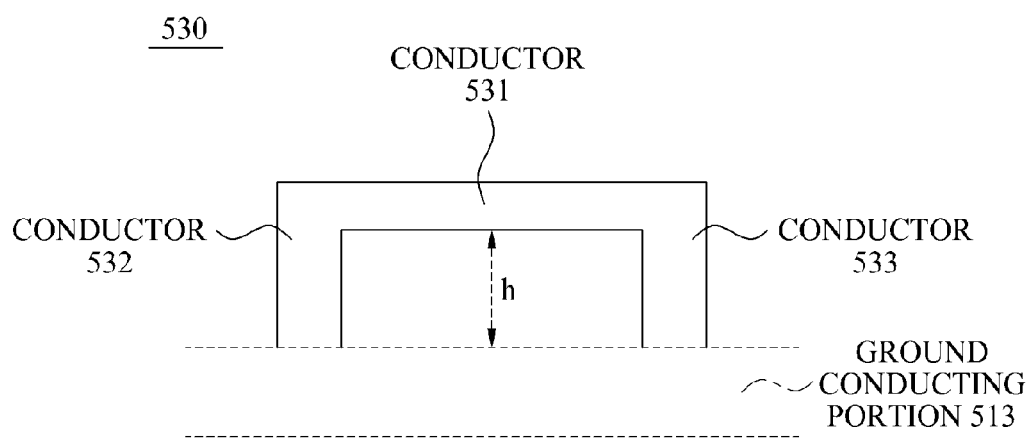
Figure 11B:
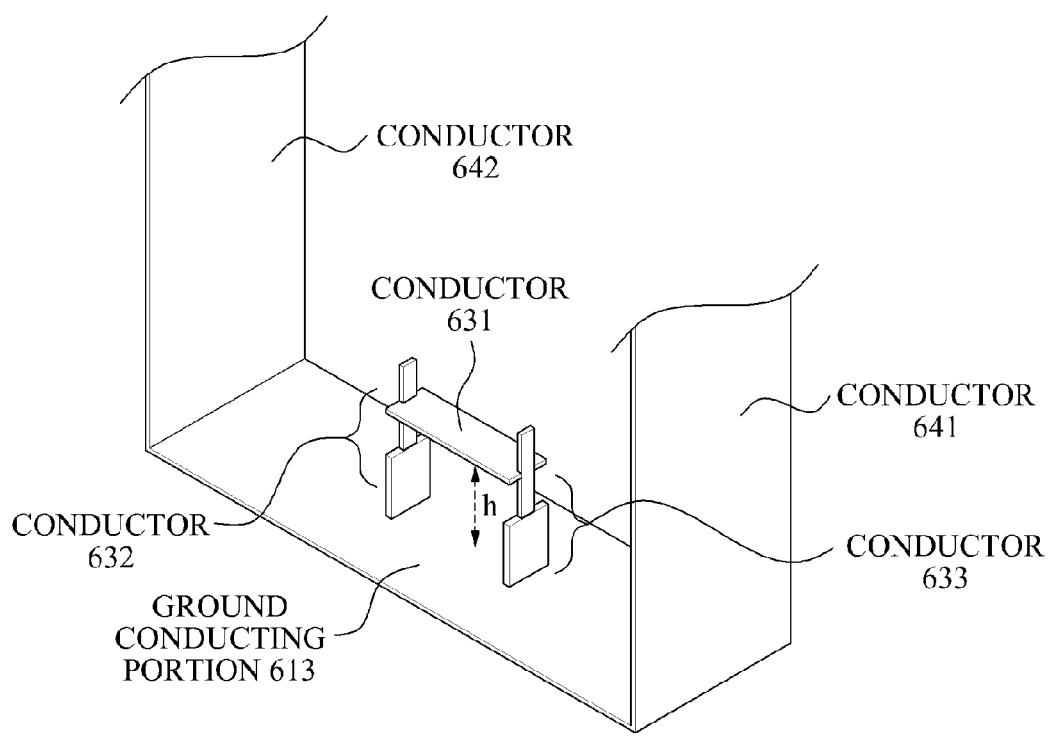

FIG. 11A illustrates one embodiment of the matcher 530 used in the resonator 500 provided in the 2D structure of FIG. 5, and FIG. 11B illustrates one embodiment of the matcher 630 used in the resonator 600 provided in the 3D structure of FIG. 6.

FIG. 11A illustrates a portion of the 2D resonator including the matcher 530, and FIG. 11B illustrates a portion of the 3D resonator of FIG. 6 including the matcher 630.

Referring to FIG. 11A, the matcher 530 may include the conductor 531, a conductor 532, and a conductor 533. The conductors 532 and 533 may be connected to the ground conducting portion 513 and the conductor 531. The impedance of the 2D resonator may be determined based on a distance h between the conductor 531 and the ground conducting portion 513, for instance. The distance h between the conductor 531 and the ground conducting portion 513 may be controlled by the controller. The distance h between the conductor 531 and the ground conducting portion 513 may be adjusted using a variety of schemes. For example, the schemes may include one or more of the following: a scheme of adjusting the distance h by adaptively activating one of the conductors 531, 532, and 533, a scheme of adjusting the physical location of the conductor 531 up and down, or the like.

Referring to FIG. 11B, the matcher 630 may include the conductor 631, a conductor 632, a conductor 633 and conductors 641 and 642. The conductors 632 and 633 may be connected to the ground conducting portion 613 and the conductor 631. The conductors 632 and 633 may be connected to the ground conducting portion 613 and the conductor 631. The impedance of the 3D resonator may be determined based on a distance h between the conductor 631 and the ground conducting portion 613. The distance h between the conductor 631 and the ground conducting portion 613 may be controlled by the controller, for example. Similar to the matcher 530 included in the 2D structured resonator, in the matcher 630 included in the 3D structured resonator, the distance h between the conductor 631 and the ground conducting portion 613 may be adjusted using a variety of schemes. For example, the schemes may include one or more of the following a scheme of adjusting the distance h by adaptively activating one of the conductors 631, 632, and 633, a scheme of adjusting the physical location of the conductor 631 up and down, or the like.

In some implementations, the matcher may include an active element. Thus, a scheme of adjusting an impedance of a resonator using the active element may be similar as described above. For example, the impedance of the resonator may be adjusted by changing a path of a current flowing through the matcher using the active element.

Figure 12:
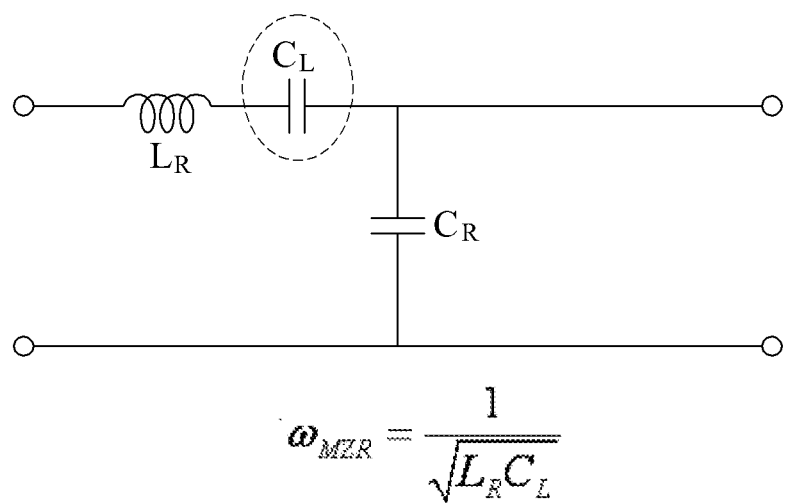
FIG. 12 is a diagram illustrating one equivalent circuit of a resonator for a wireless power transmission of FIG. 5.

FIG. 12 illustrates one equivalent circuit of the resonator 500 for the wireless power transmission of FIG. 5.

The resonator 500 of FIG. 5 for the wireless power transmission may be modeled to the equivalent circuit of FIG. 12. In the circuit depicted in FIG. 12, $L_R$ denotes an inductance of the power transmission line, $C_L$ denotes the capacitor 520 that is inserted in a form of a lumped element in the middle of the power transmission line, and $C_R$ denotes a capacitance between the power transmissions and/or ground of FIG. 5.

In some instances, the resonator 500 may have a zeroth resonance characteristic. For example, when a propagation constant is "0", the resonator 500 may be assumed to have $\omega_{MZR}$ as a resonance frequency. The resonance frequency $\omega_{MZR}$ may be expressed by Equation 3.

$$\omega_{MZR} = \frac{1}{\sqrt{L_R C_L}} \quad \text{[Equation 3]}$$

In Equation 3, MZR denotes a Mu zero resonator.

Referring to Equation 3, the resonance frequency $\omega^{MZR}$ of the resonator 500 may be determined by $$\frac{L_R}{C_L}.$$

A physical size of the resonator 500 and the resonance frequency $\omega_{MZR}$ may be independent with respect to each other. Since the physical sizes are independent with respect to each other, the physical size of the resonator 500 may be sufficiently reduced.

The units described herein may be implemented using hardware components and/or software components in various embodiments. For example, a processing device may be implemented using one or more general-purpose or special purpose computers, such as, for example, a processor, a controller and an arithmetic logic unit, a digital signal processor, a microcomputer, a field programmable array, a programmable logic unit, a microprocessor or any other device capable of responding to and executing instructions in a defined manner. The processing device may run an operating system (OS) and one or more software applications that run on the OS. The processing device also may access, store, manipulate, process, and create data in response to execution of the software. For purpose of simplicity, the description of a processing device is used as singular; however, one skilled in the art will appreciated that a processing device may include multiple processing elements and multiple types of processing elements. For example, a processing device may include multiple processors or a processor and a controller. In addition, different processing configurations are possible, such a parallel processors.

The software may include a computer program, a piece of code, an instruction, or some combination thereof, for independently or collectively instructing or configuring the processing device to operate as desired. Software and data may be embodied permanently or temporarily in any type of machine, component, physical or virtual equipment, computer storage medium or device, or in a propagated signal wave capable of providing instructions or data to or being interpreted by the processing device. The software also may be distributed over network coupled computer systems so that the software is stored and executed in a distributed fashion. In particular, the software and data may be stored by one or more computer readable recording mediums. The computer readable recording medium may include any data storage device that can store data which can be thereafter read by a computer system or processing device. Examples of the computer readable recording medium include read-only memory (ROM), random-access memory (RAM), CD-ROMs, magnetic tapes, floppy disks, optical data storage devices. Also, functional programs, codes, and code segments for accomplishing the example embodiments disclosed herein can be easily construed by programmers skilled in the art to which the embodiments pertain based on and using the flow diagrams and block diagrams of the figures and their corresponding descriptions as provided herein.

A number of examples have been described above. Nevertheless, it should be understood that various modifications may be made. For example, suitable results may be achieved if the described techniques are performed in a different order and/or if components in a described system, architecture, device, or circuit are combined in a different manner and/or replaced or supplemented by other components or their equivalents. Accordingly, other implementations are within the scope of the following claims.

What is claimed is:

1. A power converter in a resonance power transmission system, the power converter comprising:
   a source resonator;
   an input end configured to receive a direct current (DC) voltage of a predetermined level;
   a first power converter configured to convert the DC voltage of a predetermined level to an alternating current (AC) signal using a first switching pulse signal having substantially the same frequency as a resonant frequency;
   a second power converter configured to convert the DC voltage of a predetermined level to an AC signal using a second switching pulse signal having an opposite phase to the first switching pulse signal;
   a first short circuit configured to reduce or eliminate an odd harmonic of only the AC signal directly outputted from the first power converter, and to provide the AC signal where the odd harmonic is reduced or eliminated to the source resonator, wherein the first short circuit comprises a first capacitor and a first inductor tuned to the source resonator, and values of the first capacitor and the first inductor are determined based on a frequency of an odd harmonic component of the AC signal outputted from the first power converter; and a second short circuit configured to reduce or eliminate an odd harmonic of only the AC signal directly outputted from the second power converter, and to provide the AC signal where the odd harmonic is reduced or eliminated to the source resonator, wherein the second short circuit comprises a second capacitor and a second inductor tuned to the source resonator, and values of the second capacitor and the second inductor are determined based on a frequency of an odd harmonic component of the AC signal outputted from the second power converter, wherein the first and second short circuits are further configured such that odd harmonic elements of the AC signal output from the first short circuit are of opposite phase to odd harmonic elements of the AC signal output from the second short circuit.

2. The power converter of claim 1, wherein the resonant frequency corresponds to a range from 2 to 20 MHz.

3. The power converter of claim 1, wherein the AC signal outputted from the first short circuit has an opposite phase to the AC signal outputted from the second short circuit.

4. The power converter of claim 1, wherein the resonant frequency is provided by the source resonator.

5. The power converter of claim 1, wherein the AC signal of the first short circuit is combined with the AC signal of the second short circuit and provided to the source resonator.

6. The power converter of claim 1, wherein the first power converter comprises a first Direct Current/Alternating Current (DC/AC) inverter and wherein the second power converter comprises a second DC/AC inverter configured to convert DC voltage to AC voltage.

7. The power converter of claim 1, wherein the first power converter is configured to convert the Direct Current (DC) voltage of a predetermined level to a first AC signal utilizing the first switching pulse, and wherein the second power converter is configured to convert the DC voltage of the predetermined level to a second AC signal utilizing the second switching pulse.

8. The power converter of claim 6, wherein the first power converter further comprises a switching device configured to be turned on when the first switching pulse signal is at a maximum frequency and to be turned off when the second switching pulse signal is at a minimum frequency.

9. An apparatus for transmitting a resonance power, the apparatus comprising:

a source resonator;

a voltage control unit configured to receive an input of an alternating current (AC) signal of a first frequency band, and to output a direct current (DC) voltage of a predetermined level;

a first power converter configured to convert the DC voltage of a predetermined level to an AC signal using a first switching pulse signal of a second frequency band;

a second power converter configured to convert the DC voltage of a predetermined level to an AC signal using a second switching pulse signal having an opposite phase to the first switching pulse signal;

a first short circuit configured to reduce or eliminate an odd harmonic of only the AC signal directly outputted from the first power converter, wherein the first short circuit comprises a first capacitor and a first inductor tuned to the source resonator, and values of the first capacitor and the first inductor are determined based on a frequency of an odd harmonic component of the AC signal outputted from the first power converter; and a second short circuit configured to reduce or eliminate an odd harmonic of only the AC signal directly outputted from the second power converter, wherein the second short circuit comprises a second capacitor and a second inductor tuned to the source resonator, and values of the second capacitor and the second inductor are determined based on a frequency of an odd harmonic component of the AC signal outputted from the second power converter;

wherein the source resonator is configured to transfer an AC power, corresponding to an output signal of the first short circuit and the second short circuit, to a target resonator, and wherein the first and second short circuits are further configured such that odd harmonic elements of the output signal of the first short circuit are of opposite phase to odd harmonic elements of the output signal of the second short circuit.

10. The apparatus of claim 9, wherein the source resonator comprises:

a transmission line comprising a first signal conducting portion, a second signal conducting portion, and a ground conducting portion corresponding to the first signal conducting portion and the second signal conducting portion;

a first conductor configured to electrically connect the first signal conducting portion to the ground conducting portion;

a second conductor configured to electrically connect the second signal conducting portion to the ground conducting portion; and at least one capacitor inserted between the first signal conducting portion and the second signal conducting portion in series with respect to a current flowing through the first signal conducting portion and the second signal conducting portion.

11. The apparatus of claim 10, wherein the source resonator further comprises:

a matcher, located inside a loop formed by the transmission line, the first conductor, and the second conductor, configured to adjust an impedance of the source resonator.

12. A power converter comprising:

a source resonator;

at least one power converter circuit configured to receive a first signal to output a first Alternating Current (AC) signal and a second AC signal, the at least one power converter circuit comprising a first power converter and a second power converter;

a first short circuit configured to reduce or eliminate an odd harmonic of only the first AC signal directly outputted from the first power converter, wherein the first short circuit comprises a first capacitor and a first inductor tuned to the source resonator, and values of the first capacitor and the first inductor are determined based on a frequency of an odd harmonic component of the first AC signal outputted from the first power converter; and a second short circuit configured to reduce or eliminate an odd harmonic of only the second AC signal directly outputted from the second power converter, wherein the second short circuit comprises a second capacitor and a second inductor tuned to the source resonator, and values of the second capacitor and the second inductor are determined based on a frequency of an odd harmonic component of the second AC signal outputted from the second power converter, wherein the first and second short circuits are configured such that odd harmonic elements of an output signal of the first short circuit are of opposite phase to odd harmonic elements of an output signal of the second short circuit.

13. The power converter of claim 12, wherein the power converter circuit further comprises a switch.

14. The power converter of claim 13, wherein the switch is configured to receive a switching pulse signal.

15. The power converter of claim 12, wherein the first signal is direct current (DC) voltage of a predetermined level.

16. The power converter of claim 12, wherein values for the first and second capacitor C and the first and second inductor L are determined based on the frequency of the odd harmonic fodd according to the following equation:

$$LC = \frac{1}{(2\pi f_{odd})}.$$

17. The power converter of claim 12, wherein the first power converter and the second power converter are driven at opposite phases to each other.

18. A resonance power transmission system comprising the power converter of claim 12.

* * * * *